United States Patent [19]

Haferl

[11] 3,868,537

[45] Feb. 25, 1975

[54] AMPLIFIER WHICH CONSUMES A SUBSTANTIALLY CONSTANT CURRENT

[75] Inventor: Peter Eduard Haferl, Adliswil, Switzerland

[73] Assignee: RCA Corporation, New York, N.Y.

[22] Filed: July 27, 1973

[21] Appl. No.: 383,207

[30] Foreign Application Priority Data

Feb. 5, 1973 Great Britain .................... 5613/73

[52] U.S. Cl. ................. 315/389, 315/27 GD, 323/8, 315/403

[51] Int. Cl. ........................................ H01j 29/70

[58] Field of Search ....... 315/27 TD, 27 GD; 323/8, 323/22

[56] References Cited

UNITED STATES PATENTS

| | | | |
|---|---|---|---|
| 2,912,638 | 11/1959 | McNamee | 323/22 |
| 3,402,320 | 9/1968 | Christopher | 315/27 TD |
| 3,488,554 | 1/1970 | Voige | 315/27 TD |
| 3,492,527 | 1/1970 | Griffey | 315/27 TD |

*Primary Examiner*—Maynard R. Wilbur
*Assistant Examiner*—T. M. Blum
*Attorney, Agent, or Firm*—Eugene Whitacre; Paul J. Rasmussen

[57] ABSTRACT

An amplifier derives a substantially constant current from a direct current voltage source. A first output transistor is coupled in an emitter follower configuration and is biased to provide the desired constant current consumption of the amplifier at zero input signal voltage. The load circuit is alternating current coupled to its emitter. The collector of a second output transistor is also coupled to the emitter of the first output transistor. The emitter of the second output transistor is coupled to the remaining terminal of the load. This junction is coupled through a monitor resistor to a point of reference potential. The monitor resistor monitors the current consumed by the amplifier and the voltage across it controls a third current regulator transistor which is coupled to the base of the second output transistor and controls its conductivity.

15 Claims, 4 Drawing Figures

AMPLIFIER WHICH CONSUMES A SUBSTANTIALLY CONSTANT CURRENT

BACKGROUND OF THE INVENTION

This invention relates to a constant current amplifier. In many television receivers, voltage for receiver circuits such as audio, video, or vertical deflection circuits is obtained by rectifying and filtering alternating current waveforms obtained from the horizontal deflection circuitry as it operates during the trace and retrace intervals of each horizontal deflection cycle.

A problem attendant with the use of these rectified waveforms is that fluctuations in the loads presented by the load circuits often cause disturbances in the performance of the horizontal deflection circuitry from which power for the load circuits is derived.

In the situation in which the audio amplifier or vertical deflection amplifier is designed to consume power supplied by rectified horizontal deflection pulses, the substantial alternating current requirements of the audio amplifier output stages or vertical deflection winding cause modulation of the supply current with the audio signal or the sawtooth current waveform induced in the vertical deflection winding. This modulation of supply current causes fluctuation in the operating voltage and current of the horizontal deflection circuitry. Unless the fluctuation can be eliminated, the viewer may see both the width of the raster and the brightness of the display vary.

A solution to this problem is to eliminate the modulation caused by the current supplied to the audio output stages or vertical deflection winding.

SUMMARY OF THE INVENTION

In accordance with the invention, an amplifier which consumes a substantially constant current comprises a source of direct current voltage, a source of signal voltage waveforms, a load impedance, sensing means, and first, second and third active current conducting means. The main current conducting path of the first active current conducting means is serially coupled between the source of direct current voltage and the load impedance and a control electrode of the first active current conducting means is coupled to the source of signal voltage waveforms. The main current conducting path of the second active current conducting means is coupled at one terminal to the junction of the main current conducting path of the first active current conducting means and the load impedance and at the other terminal to the other terminal of the load impedance. The sensing means are coupled between this second junction of the main current conducting path of the second active current conducting means and the load impedance and a point of reference potential for sensing current flow between this second junction and reference potential. The main current conducting path of the third active current conducting means is coupled between the source of direct current voltage and a point of reference potential. A control electrode of the third active current conducting means is coupled to the sensing means and is responsive to signals representative of current through the sensing means. A control electrode of the second active current conducting means is coupled to the main current conducting path in the third active current conducting means for being controlled by signals representative of current flow through the sensing means, thereby altering the conductivity of the second active current conducting means for rendering the sum of the current through the load impedance and the main current conducting path of the second active current conducting means substantially constant.

The operation of the invention will best be understood by referring to the following description and accompanying drawings, of which:

DETAILED DESCRIPTION OF EMBODIMENTS OF THE INVENTION

Figure 1:
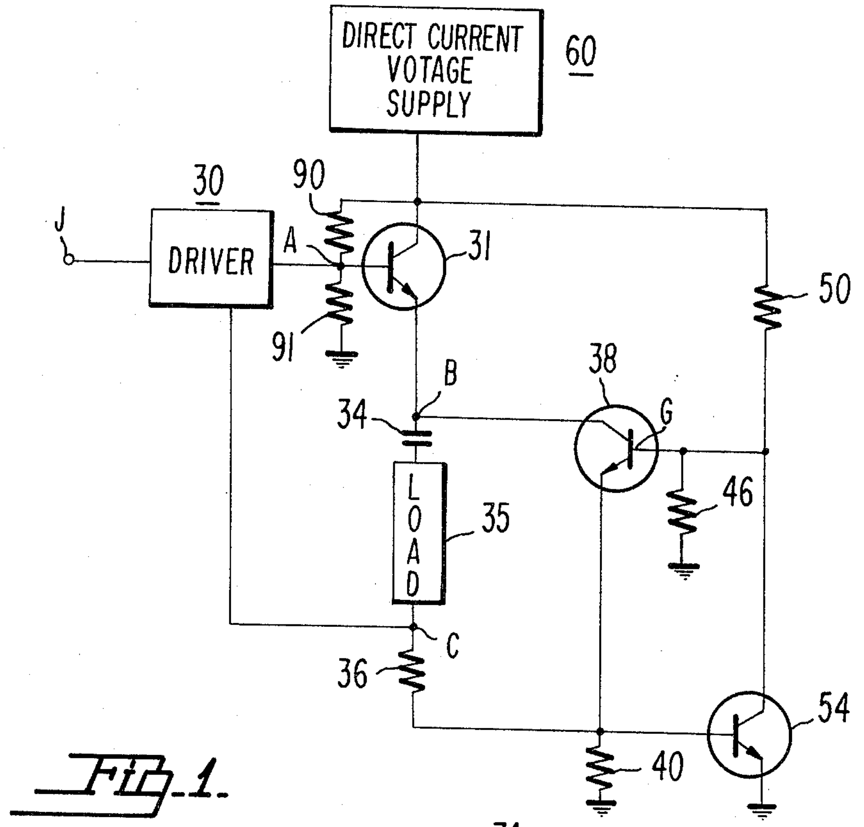
FIG. 1 is a partly schematic and partly block circuit diagram of an embodiment of the invention comprising an amplifier.

In the circuit illustrated in FIG. 1 a driver amplifier 30 has its output terminal connected to one terminal each of two resistors 90 and 91. Resistor 90 has its other terminal connected to a direct current voltage supply 60. Resistor 91 has its other terminal connected to a point of reference potential.

A transistor 31 has its base electrode, point A, coupled to the junction of the driver output terminal and resistors 90 and 91. The collector electrode of transistor 31 is coupled to direct current voltage supply 60 and its emitter is coupled to the positive terminal of a blocking capacitor 34 and to the collector electrode of a transistor 38. The emitter electrode of transistor 38 is connected to one terminal of a monitor resistor 40, the other terminal of which is coupled to a point of reference potential.

The negative terminal of direct current blocking and coupling capacitor 34 is connected to one terminal of a load impedance 35, the other terminal of which is connected to an alternating current feedback resistor 36. Another method for deriving feedback is to take feedback signal from point B and feed it back to driver stage 30. It is understood that feedback may not be desired, in which case resistor 36 and its connections to driver amplifier 30 (points C and D) may be omitted. The other terminal of resistor 36 is coupled to the junction of the emitter of transistor 38 and resistor 40.

Also connected to this junction is the base of a current regulator transistor 54. The emitter of transistor 54 is connected to a point of reference potential and its collector is connected to point G, the base of transistor 38. A direct current biasing resistor 46 is also connected to the base of transistor 38 and ground.

A direct current limiting resistor 50 is connected between point G and direct current voltage supply 60.

Transistor 54 is a current monitoring transistor. It regulates the base drive current of transistor 38 by monitoring the voltage drop obtained across resistor 40 when current flows through it. The current through resistor 40 equals the emitter current of transistor 31, neglecting the feedback current from point C to the driver stage 30. When a voltage is impressed upon the base, point A, of emitter follower transistor 31, an approximately equal voltage appears between its emitter and ground, charging capacitor 34 to the voltage on the emitter of transistor 31. Thus, a constant current tends to flow from the emitter of transistor 31 to ground through resistor 40 by virtue of the conductivity of transistor 54 which results from current flow through resistor 40 and the resultant effect of the conductivity of transistor 54 upon the conductivity of transistor 38.

The current through resistor 40 is the sum of the load current flowing through capacitor 34, load impedance 35 and alternating current feedback resistor 36, and the collector current of transistor 38, disregarding the drive current component of transistor 38 which adds a slight ripple to the substantially constant current through resistor 40.

The value of resistor 40 and the base-emitter junction drop of transistor 54 determine the constant current consumption of the entire circuit. The base-emitter junction drop for silicon transistors is approximately 0.7 volt. With a value of one ohm for resistor 40, the current consumption of the amplifier would be 700 milliamperes. To insure that constant current consumption is always maintained, the value of resistor 40 should be chosen so that this constant current is always slightly greater than the peak anticipated load current. As long as transistors 31, 38 and 54 are in a state of conduction, then, this constant current will flow from the emitter of transistor 31, through either the load impedance or the collector-emitter path of transistor 38 and through resistor 40 to ground.

When no current is flowing in the load, the current through resistor 40 is maintained from the constant current source, the emitter of transistor 31, by virtue of the base drive current supplied from the direct current voltage supply 60 through resistor 50 to the base of transistor 38. As was previously explained, excess base drive current is shunted to ground through transistor 54 by virtue of the fact that when excess base drive current causes transistor 38 to be more conductive, more current flows in resistor 40 causing transistor 54 to be more conductive and thereby decreasing the conductivity of transistor 38.

The voltage divider comprising resistors 90 and 91 determines the quiescent operating point of the amplifier. In the absence of input signal voltage at point A, a constant current flows through transistors 31 and 38 and resistor 40 to ground. A constant current also flows in transistor 54. No current flows in the load after the initial charging of capacitor 34 since capacitor 34 is charged to the emitter voltage of transistor 31.

When a positive going input signal voltage is introduced at point A the base and emitter of transistor 31 rise equal amounts in response to the signal voltage and, as a result, there is a rise in the charge voltage of capacitor 34 as it charges to the emitter voltage of transistor 31. As current flows in load impedance 35 and feedback resistor 36 to build this charge, transistor 38 becomes less conductive to allow some of the constant current being drawn from the emitter of transistor 31, by the previously explained interaction of resistor 40 and transistor 54 and the effect of the resultant conductivity of transistor 54 on the base of transistor 38, to flow through load impedance 35.

As the base and emitter voltages of transistor 31 fall in response to a negative going input signal voltage, the voltage across capacitor 34 decreases below the emitter voltage of transistor 31 with respect to ground. The current resulting in this decreased charge flows around the loop created by load impedance 35 and feedback resistor 36 and the collector-emitter circuit of transistor 38 inducing load current in the opposite direction, i.e., in an upwards direction through load 35, to that induced by positive-going voltage signals impressed at point A. Resistor 40 senses this decreasing voltage across capacitor 34 by sensing that current is required to discharge capacitor 34 to the lower voltage on the emitter of transistor 31 and renders transistor 54 less conductive and transistor 38 more conductive in response.

It can thus be seen that the constant current output of transistor 31 to ground through resistor 40 is modulated only within the amplifier in the collector-emitter circuit of transistor 38 by the load current flowing upward through load 35. That is, when peak positive current is flowing in load impedance 35, and out of the amplifier through resistor 40 to ground, no current is flowing in transistor 38. Conversely, when peak negative current is flowing in load impedance 35, twice the constant consumption current drawn from the emitter of transistor 31 through resistor 40 is flowing in transistor 38. Half of this current direction as capacitor 34 discharges and half of it comprises the constant current output of transistor 31 consumed by the amplifier, which flows out of the amplifier via transistor 38 through resistor 40.

Figure 2:
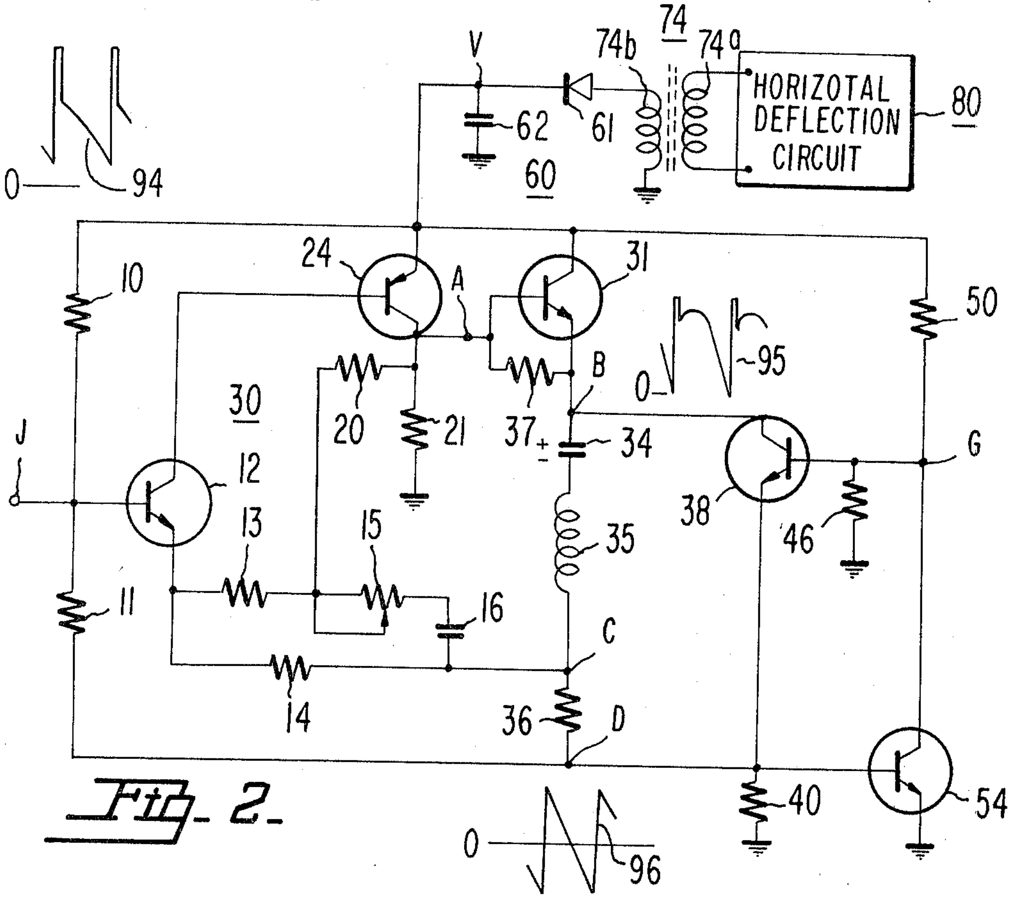
FIG. 2 is a partly schematic and partly block circuit diagram of a second embodiment of the invention in a vertical deflection amplifier with accompanying waveforms.

In FIG. 2, which is a circuit diagram of a vertical deflection amplifier embodying the invention, biasing resistors 10 and 11 are serially connected between the source of direct current voltage 60 and current monitoring resistor 40. The base of a pre-driver transistor 12 is coupled to the junction of resistors 10 and 11. Direct current voltage is supplied from direct current voltage source 60 comprising a rectifying and filtering circuit consisting of a horizontal output transformer 74, a primary winding, 74*a*, of which is coupled to the horizontal deflection circuit 80 of the television receiver. Circuit 60 transforms and rectifies alternating current waveforms obtained from circuit 80 during the trace or retrace intervals of each deflection cycle. A secondary winding 74*b* of transformer 74 is coupled to one terminal of a rectifying diode 61, the other terminal of which is coupled to a filtering and storage capacitor 62. Point V is the supply terminal of the junction of diode 61 and capacitor 62. The other terminal of capacitor 62 is coupled to ground. In this embodiment, load impedance 35 is represented as a vertical deflection winding 35 which in practice is split in two and may be connected serially or in parallel.

The emitter of a transistor 12 is connected to a feedback and linearity network consisting of a parallel combination of a feedback resistor 14 with the series combination of a resistor 13, a variable potentiometer resistor 15 and a capacitor 16. This parallel combination is then coupled to a terminal of a deflection current sampling resistor 36. The other terminal of resistor 36 is coupled to the junction of resistors 11 and 40.

The collector of transistor 12 is direct current coupled to the base of a driver transistor 24. The emitter of transistor 24 is coupled to the direct current voltage source 60. The collector of transistor 24 is coupled through a resistor 21 to ground and also coupled through feedback resistor 20 to the junction of feedback resistor 13 and potentiometer 15.

The collector of transistor 24 is coupled to the base (point A) of transistor 31. A base-emitter junction protection resistor 37 is coupled between the base and emitter of transistor 31. Biasing resistors 90 and 91, shown in FIG. 1, have been removed from the base circuit of transistor 31. All other points, elements, and circuits represented by the same numerals as appear in FIG. 1 perform the same functions.

In this embodiment of the invention an input voltage signal, waveform 94, representing a vertical deflection rate waveform obtained from a suitable source, not shown, is applied at point J, the base of transistor 12. The vertical deflection sawtooth waveform is of a type such as is provided by the vertical deflection sawtooth generator claimed in my copending United States application Ser. No. 351,407 filed Apr. 16, 1973, and entitled, "Vertical Deflection Circuit." Resistors 10 and 11 comprise a voltage divider for the base of input transistor 12. This voltage divider establishes the quiescent operating point of transistor 12 and, in turn, the quiescent operating points of transistors 24 and 31 which are DC coupled to transistor 12 in this embodiment.

As the decreasing portion of waveform 94 appears on the base of transistor 12, it becomes increasingly less conductive so its collector voltage rises. This makes transistor 24, the second stage of the noninverting driver amplifier comprising transistors 12 and 24 and their associated biasing and feedback circuitry, also less conductive. As a result, the base and emitter voltages of transistor 31 decrease in equal amounts and current flowing in the load circuit comprising blocking capacitor 34, deflection winding 35 and feedback resistor 36 begins to decrease in the same manner as the input signal 94. The first half of the decreasing portion of waveform 94 represents the first half of the vertical trace interval of each deflection cycle.

At some point during this period of decreasing current, as capacitor 34 is charged to the polarity as indicated, the voltage on the emitter of transistor 31 becomes equal to the voltage across capacitor 34 and capacitor 34 begins to discharge through the path provided by the collector-emitter circuit of transistor 38 as previously explained in conjunction with FIG. 1. It is at this time that the current flow in the load circuit changes direction and begins to increase in the opposite direction as capacitor 34 discharges itself through the loop comprising transistor 38, resistor 36 and vertical deflection winding 35.

The shape of this discharging waveform in the load circuit may be altered somewhat to produce the desired waveshape by adjusting potentiometer 15 which, as explained in detail in the application referred to above, decouples some of the feedback from transistor 24 to transistor 12.

Voltage induced across resistor 36 by virtue of the alternating deflection current flowing in the deflection winding during the trace interval is fed back to both stages of the driver amplifier by virtue of resistors 13, 14, and 20.

The voltage waveform at point B, the positive terminal of capacitor 34 is illustrated by waveform 95. Note that at some point during the decreasing portion of the input signal waveform 94, the voltage on the positive terminal of capacitor 34 begins to decrease as the capacitor begins to discharge by the previously explained action. This point represents the beginning of the second half of the trace interval.

At the end of the trace interval, a voltage pulse portion appears at the input terminal, point J, of the driver amplifier, as shown by the most positive pulse portion of waveform 94.

This pulse portion causes transistors 12, 24, and 31 to all be driven into saturation at which time approximately supply voltage appears at point B. This voltage pulse portion is shown in waveform 95 also. The introduction of this saturation pulse at point B initiates the retrace interval of the vertical deflection cycle.

At this time the current in deflection winding 35 which has been increasing in an approximately linear fashion in the negative direction upward through deflection winding 35 suddenly begins to decrease in this direction in an effort to flow in the direction dictated by the positive voltage appearing at point B. During the first half of the retrace interval, much of this impressed supply voltage appears across deflection winding 35. Then as the current in the deflection winding reverses directions, capacitor 34 begins to charge toward supply voltage again. The charging interval immediately after current reversal represents the beginning of the second half of the retrace interval.

Before the capacitor 34 can sustain a full charge, however, the saturation pulse ends at the input to the driver, point J, and on the control electrode of transistor 31, point A.

As transistor 31 continues to supply constant current to the circuit, as previously explained, it continues to charge capacitor 34, initiating the next deflection trace interval as waveform 95 shows.

It should be noted that constant current flows from the emitter of transistor 31 during the entire deflection cycle since its current is regulated as the current output of the amplifier through resistor 40 as was previously explained. The variation of the input signal voltage has no effect upon the constant input current through transistor 31 nor upon the constant output current through resistor 40 from the amplifier.

It should be noted also that the deflection current follows the input signal by virtue of the decreasing emitter voltage at constant emitter current of transistor 31. The emitter voltage of transistor 31 follows approximately the input voltage at point J since the voltage at point A, the base of transistor 31, is just the amplified difference voltage between the input voltage, waveform 94, and feedback voltage, waveform 96. Feedback from the deflection current sampling resistor 36 shown by waveform 96 insures that the deflection current will assume the same shape as the input voltage waveform 94 less the influence provided to the bottom half of the deflection current waveform, waveform 96, by the bottom linearity control, potentiometer 15 and capacitor 16, which acts on the emitter voltage of transistor 12 and the collector voltage of transistor 24. It should be noted that this circuit does not provide top linearity correction, that being provided by the vertical deflection rate waveform generator disclosed in my aforementioned copending United States patent application. It is to be understood that any suitable vertical deflection rate generator providing waveforms similar to waveform 94 may be used with the deflection amplifier of FIG. 2.

Figure 3:
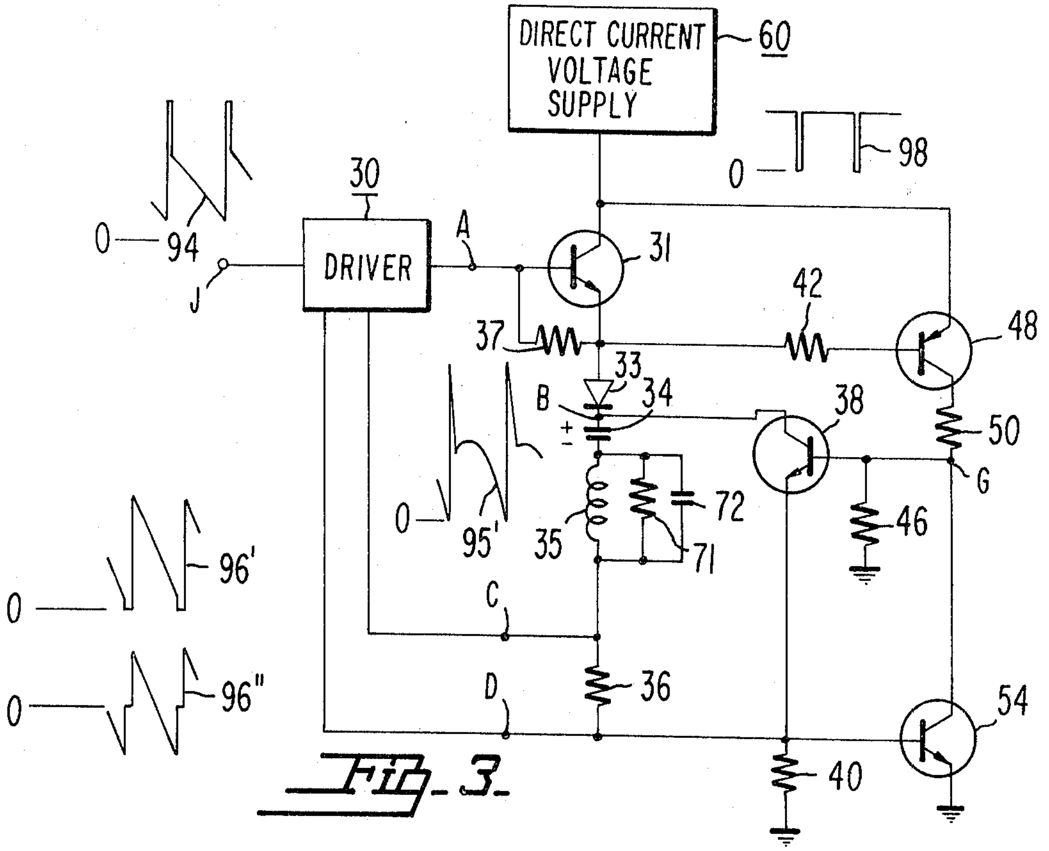
FIG. 3 is a partly schematic and partly block circuit diagram of a third embodiment of the invention in a vertical deflection amplifier with accompanying waveforms.

In the embodiment illustrated in FIG. 3, those circuits, elements, and points represented by the same numerals and letters as appear in FIGS. 1 and 2 perform the same functions.

Additionally a parallel network of a capacitor 72 and a resistor 71 is coupled in parallel with deflection winding 35 to form a parallel resonant circuit with the winding. A deflection yoke winding disconnect diode 33 is added between the emitter of transistor 31 and the junction of the collector of transistor 38 and capacitor 34.

A transistor 48 is coupled between the collector of transistor 31 and the base of transistor 38, the collector of transistor 48 being serially coupled through resistor 50 to the base of transistor 38. The base of transistor 48 is serially coupled through current limiting resistor 42 to the emitter of transistor 31.

In this third embodiment of the invention illustrated in FIG. 3, capacitor 72 and resistor 71 in parallel with deflection winding 35 determine the length of the retrace interval and the height of the retrace pulse. Capacitor 72 rings for one-half cycle with the deflection winding during the retrace interval of each deflection cycle to shape the retrace pulse and resistor 71 limits the amplitude of the voltage induced across the parallel combination by virtue of the oscillations.

A deflection yoke winding disconnect diode 33 unclamps the deflection winding 35, ringing capacitor 72 and damping resistor 71 from supply potential which, as previously explained, appears on the emitter of transistor 31 by virtue of the saturation retrace pulse during the retrace interval and allows the voltage induced across the ringing circuit to rise substantially above the supply voltage.

This disconnect function is further carried out by transistor 48. The base of transistor 48 is coupled through resistor 42 to the emitter of transistor 31. When the retrace pulse appears and the emitter of transistor 31 rises to approximately supply potential, transistor 48 is driven into cutoff. Since the drive current for transistor 38 is cupplied through transistor 48, transistor 38 and transistor 54, whose conductivity derives from current flow through resistor 40, which is now stopped by virtue of transistor 38 being in cutoff, are both rendered non-conductive, disabling the shunt path comprising transistor 38 from the positive terminal of the parallel ringing circuit to reference potential.

The resultant high voltage ringing peaks appear in waveform 95', the voltage waveform at point B of the circuit of FIG. 3.

Note further that this placement of the disconnect diode protects the base-emitter junctions of transistors 31 and 48 from the high voltage retrace pulses.

With the disconnect elements in the circuit, it may be seen from the preceeding discussion that no current is drawn from the direct current voltage supply during the retrace interval. Transistors 48, 38 and 54 are all in cutoff and the high ringing voltage at point B has back biased disconnect diode 33 so that no current flows from the emitter of transistor 31. The voltage waveforms 96' and 96'', the voltages between point C and ground and between points C and D, respectively, show that no current is flowing in either feedback resistor 36 or monitor resistor 40 during the retrace interval.

Combining the substantially constant current drawn from direct current voltage supply 60 during the trace interval with the zero current drawn from it during the retrace interval by virtue of the disconnect provision yields current waveform 98 as the current provided by transistor 31 for consumption in the amplifier.

Figure 4:
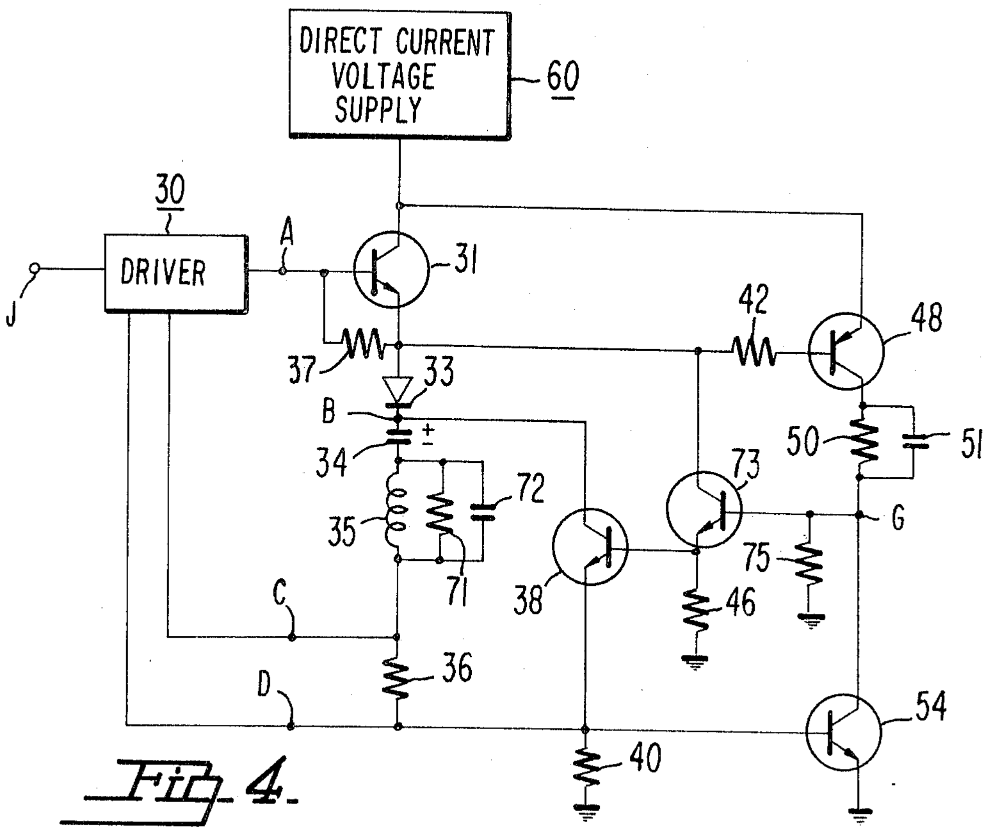
FIG. 4 is a partly schematic and partly block circuit diagram of a fourth embodiment of the invention in a vertical deflection amplifier.

In a fourth embodiment of the invention illustrated in FIG. 4 a capacitor 51 has been added in parallel with resistor 50 and an emitter follower transistor 73 has been added with its emitter coupled to the junction of the base of transistor 38 and resistor 46, its collector coupled to the junction of the emitter of transistor 31 and resistor 42 and its base coupled to the junction of the collector of transistor 54 and resistor 50 (point G). A biasing resistor 75 is coupled between the base of transistor 73 and ground.

Those circuits, elements, and points represented by the same numerals and letters as appear in FIGS. 1, 2, and 3 perform the same functions.

The importance of transistor 73 may best be understood by noting that any fluctuations in the current flowing through the collector of transistor 54 are not monitored in resistor 40. Ripple introduced on the current drawn from direct current voltage supply 60 by regulator transistor 54 can be reduced by reducing the current through resistor 50 and, in order to insure adequate drive signal to transistor 38, amplifying the drive signal appearing at point G in transistor 73. The ripple induced by variations in the current flow through the collector of transistor 54 is thereby reduced since the current through resistor 50 can be reduced by a factor equal to the stage gain of transistor 73. This is done simply by increasing the value of resistor 50 by that factor. Resistor 75 is a base bias resistor for transistor 73. Capacitor 51 serves to suppress oscillations which might occur in the collector circuits of transistors 48 and 54 and the base circuit of transistor 73.

What is claimed is:

1. An amplifier which consumes a substantially constant direct current, comprising:

a source of direct current voltage;

a source of signal voltage waveforms;

a load impedance;

first active current conducting means, the main current conducting path of which is serially coupled between said source of direct current voltage and said load impedance and a control electrode of which is coupled to said source of signal voltage waveforms;

second active current conducting means, the main current conducting path of which is coupled at one terminal to the junction of the main current conducting path of said first active current conducting means and said load impedance to form a first junction of said load impedance and said main current conducting path of said second active current conducting means and at the other terminal to the terminal of said load impedance remote from said first junction to form a second junction of said load impedance and said main current conducting path of said second active current conducting means;

sensing means coupled between said second junction and a point of reference potential for sensing current flow between said second junction and reference potential; and third active current conducting means the main current conducting path of which is serially coupled between said source of direct current voltage and a point of reference potential and a control electrode of which is coupled to said sensing means and responsive to signals representative of current flow therethrough and a control electrode of said second active current conducting means is coupled to the main current conducting path of said third active current conducting means for being controlled by said signals representative of the current flow through said sensing means, thereby altering the conductivity of said second active current conducting means for rendering the sum of the current through said load impedance and the main current conducting path of said second active current conducting means substantially constant.

2. An amplifier when consumes a substantially constant direct current according to claim 1 wherein:
biasing means are coupled to said first active current conducting means for rendering it conductive of a constant current in the absence of said signal voltage waveforms, which current is substantially equal to the peak alternating current which is desired to be induced in said load impedance when said first active current conducting means is driven by said signal voltage waveforms.

3. An amplifier which consumes a substantially constant direct current according to claim 2 wherein:
capacitance means are coupled between the main current conducting path of said first active current conducting means and said load impedance for blocking direct current from said load impedance.

4. An amplifier which consumes a substantially constant direct current according to claim 3 wherein:
feedback means are coupled to said load impedance for generating signals representative of current flow through said load impedance and said feedback means are coupled to said source of alternating current voltage waveforms for feeding back said signals representative of current flow through said load impedance to said source of signal voltage waveforms.

5. An amplifier which consumes a substantially constant direct current according to claim 4 wherein:
said first, second and third active current conducting means comprise first, second and third transistors respectively;
said first transistor is arranged in an emitter follower configuration; and
said third transistor is arranged in a common emitter configuration.

6. An amplifier which consumes a substantially constant direct current according to claim 5 wherein:
said load impedance is a television deflection winding; and
said source of signal voltage waveforms is a driver amplifier consisting of at least a fourth transistor for amplifying deflection rate signals.

7. An amplifier which consumes a substantially constant direct current according to claim 6 wherein:
means are provided for decoupling said deflection winding from said first and second transistors during the retrace interval of said deflection rate waveforms, said means including a diode coupled between the emitter of said first transistor and said deflection winding with its anode coupled to the emitter of said first transistor; and
a fifth transistor, the main current conducting path of which is coupled between the source of direct current voltage and the main current conducting path of said third transistor and its base is coupled to the emitter of said first transistor for rendering said fifth transistor nonconductive during said retrace interval in response to retrace interval signals on the emitter of said first transistor and thereby removing control voltage from said second and third transistors rendering them nonconductive.

8. An amplifier which consumes a substantially constant current, comprising:
a source of direct current voltage;
a load impedance;
a source of signal voltage waveforms;
first active current conducting means, the main current conducting path of which is coupled to said load impedance for providing a loop comprising said load impedance and said main current conducting path of said first active current conducting means in which signal current may flow;
sensing means coupled between a first junction of said load impedance and said first active current conducting means and a point of reference potential for sensing current flow between said first junction and reference potential;
second active current conducting means, a control electrode of which is coupled to said source of signal voltage waveforms and the main current conducting path of which is serially coupled between said source of direct current voltage and a second junction of said load impedance and said first active current conducting means for providing operating current and signal voltage to said second junction;
third active current conducting means, the main current conducting path of which is coupled between said source of direct current voltage and a point of reference potential, a control electrode of which is coupled to said first junction for rendering said third active current conducting means responsive to current through said sensing means and a control electrode of said first active current conducting means is coupled to the main current conducting path of said third active current conducting means for rendering said first active current conducting means responsive to the conduction of said third active current conducting means and thereby rendering current flow through said sensing means substantially constant.

9. An amplifier which consumes a substantially constant direct current according to claim 8 wherein:
means are coupled to a control electrode of said second active current conducting means for providing bias voltage for rendering said second active current conducting means conductive of a constant current in the absence of said signal voltage waveforms which is equal to the peak alternating current which is desired to be induced in said load impedance when said second active current conducting means is driven by said signal voltage waveforms.

10. An amplifier which consumes a substantially constant current according to claim 9 wherein:
said load impedance comprises a deflection winding serially coupled to capacitance means for blocking direct current and to feedback resistance means for providing feedback signals representative of current flow through said deflection winding.

11. An amplifier which consumes a substantially constant current according to claim 10 wherein:

said source of signal voltage waveforms is a source of vertical deflection rate signals comprising a vertical deflection rate waveform generator and fourth active current conducting means coupled to said vertical deflection rate waveform generator and to said feedback resistance means for rendering said fourth active current conducting means responsive to signals representative of the difference between waveforms generated by said vertical deflection rate waveform generator and signals induced in said feedback means.

12. An amplifier which consumes a substantially constant current according to claim 11 wherein:

a diode is coupled between said second active current conducting means and said deflection winding and poled for decoupling said deflection winding from said second active current conducting means during said retrace interval.

13. An amplifier which consumes a substantially constant current according to claim 12 wherein:

said first, second and third active current conducting means comprise first, second and third transistors, respectively;

said fourth active current conducting means comprises at least a fourth transistor; and said sensing means comprises resistance means.

14. An amplifier which consumes a substantially constant current according to claim 13 wherein:

a fifth transistor has its control electrode coupled to the junction of said diode and said second transistor and its main current conducting path serially coupled between said source of direct current voltage and the junction of the control electrode of said first transistor and the main current conducting path of said third transistor for rendering said first and third transistors nonconductive during said retrace interval.

15. An amplifier which consumes a substantially constant current according to claim 14 wherein:

said first transistor has its control electrode coupled to the junction of said third and fifth transistors through a sixth transistor, said sixth transistor having its control electrode coupled to said junction and one terminal of its main current conducting path coupled to the control electrode of said fifth transistor and the other terminal connected to the control electrode of said first transistor for rendering said first transistor responsive to signals representative of the conduction of said third transistor.

* * * * *

UNITED STATES PATENT OFFICE
CERTIFICATE OF CORRECTION

PATENT NO. : 3,868,537

DATED : February 25, 1975

INVENTOR(S) : Peter Eduard Haferl

It is certified that error appears in the above-identified patent and that said Letters Patent are hereby corrected as shown below:

Column 4, line 26, after "current" insert -- flows through the load in the negative current --. Column 7, line 40, that portion reading "cupplied" should read -- supplied --

Signed and Sealed this

*ninth* Day of *September 1975*

[SEAL]

*Attest:*

RUTH C. MASON
*Attesting Officer*

C. MARSHALL DANN
*Commissioner of Patents and Trademarks*